(12) United States Patent
Wan

(10) Patent No.: US 11,328,781 B2
(45) Date of Patent: May 10, 2022

(54) ARCHITECTURE AND METHOD FOR NAND MEMORY PROGRAMMING

(71) Applicant: Yangtze Memory Technologies Co., Ltd., Hubei (CN)

(72) Inventor: Weijun Wan, Wuhan (CN)

(73) Assignee: Yangtze Memory Technologies Co., Ltd., Wuhan (CN)

(*) Notice: Subject to any disclaimer, the term of this patent is extended or adjusted under 35 U.S.C. 154(b) by 0 days.

(21) Appl. No.: 17/149,080

(22) Filed: Jan. 14, 2021

(65) Prior Publication Data
US 2022/0093193 A1 Mar. 24, 2022

Related U.S. Application Data

(63) Continuation of application No. PCT/CN2020/117315, filed on Sep. 24, 2020.

(51) Int. Cl.
   G11C 16/04 (2006.01)
   G11C 16/34 (2006.01)
   G11C 11/56 (2006.01)
   G11C 16/10 (2006.01)

(52) U.S. Cl.
   CPC ...... G11C 16/3459 (2013.01); G11C 11/5628 (2013.01); G11C 11/5671 (2013.01); G11C 16/0483 (2013.01); G11C 16/10 (2013.01)

(58) Field of Classification Search
   CPC ............ G11C 11/5628; G11C 11/5671; G11C 16/0483; G11C 16/10; G11C 16/3459
   See application file for complete search history.

(56) References Cited

U.S. PATENT DOCUMENTS

| 8,270,215 | B2 | 9/2012 | You et al. |
| 8,619,475 | B2 | 12/2013 | Aritome et al. |
| 9,165,672 | B2 | 10/2015 | Kang et al. |
| 9,208,874 | B2* | 12/2015 | Lee .................... G11C 13/0064 |
| 9,520,201 | B2 | 12/2016 | Kang et al. |

(Continued)

FOREIGN PATENT DOCUMENTS

TW          I482157 B       4/2015

OTHER PUBLICATIONS

International Search Report dated Jun. 23, 2021 in PCT/CN2020/117315, 4 pages.

*Primary Examiner* — Uyen Smet
(74) *Attorney, Agent, or Firm* — Oblon, McClelland, Maier & Neustadt, L.L.P.

(57) ABSTRACT

In a method of programming a memory device, inhibit information is stored to first latch structures and second latch structures. A first state programming voltage is applied to data lines of memory cells of the memory device to program the memory cells to the first state. A first state verification voltage is applied to the data lines of the memory cells to perform a first state verification operation on the memory cells. The first state verification operation verifies first state threshold voltages of the memory cells based on a first target value and also generates failure pattern data of the first state verification operation. The failure pattern data is then stored to the second latch structures. Further, a first level adjusted verification voltage is applied to the data lines of a portion of the memory cells that fails the first level verification operation to perform a first level adjusted verification operation.

20 Claims, 14 Drawing Sheets

(56) References Cited

U.S. PATENT DOCUMENTS

| | | |
|---|---|---|
| 9,589,659 B1 | 3/2017 | Vali et al. |
| 10,134,481 B2 | 11/2018 | Vali et al. |
| 10,818,360 B2 | 10/2020 | Lee et al. |
| 2007/0002631 A1 | 1/2007 | Kang et al. |
| 2013/0033936 A1 | 2/2013 | Aritome et al. |
| 2014/0153329 A1 | 6/2014 | Kang et al. |
| 2016/0012907 A1 | 1/2016 | Kang et al. |
| 2016/0027525 A1 | 1/2016 | Kim et al. |
| 2016/0093384 A1 | 3/2016 | Lee |
| 2017/0345511 A1 | 11/2017 | Vali et al. |
| 2020/0143886 A1 | 5/2020 | Lee et al. |
| 2020/0365220 A1* | 11/2020 | Yang .................. G11C 16/3459 |
| 2021/0125673 A1* | 4/2021 | Tachi ................. G11C 16/3459 |

* cited by examiner

| Latch | Latched Information |
|---|---|
| DS | Inhibit Information |
| DL | Inhibit Information |
| D1 | Lower Page |
| D2 | Middle Page |
| D3 | / |
| DC | Upper Page |

FIG. 7

| Latch | Latched Information |
|---|---|
| DS | ~Inhibit Information |
| DL | Inhibit Information |
| D1 | Lower Page |
| D2 | Middle Page |
| D3 | / |
| DC | Upper Page |

FIG. 8

| Latch | Latched Information |
|---|---|
| DS | ~(Inhibit Information I 1st state PV pass) |
| DL | VFC pattern |
| D1 | Lower Page |
| D2 | Middle Page |
| D3 | / |
| DC | Upper Page |

FIG. 9

| Latch | Latched Information |
|---|---|
| DS | ~(Inhibit Information I 1st state PV pass) |
| DL | Inhibit Information I 1st state 3BL) |
| D1 | Lower Page |
| D2 | Middle Page |
| D3 | / |
| DC | Upper Page |

FIG. 10

| Latch | Latched Information |
|---|---|
| DS | ~(Inhibit Information \| 1st \| 2nd \| ... \| last state PV pass) |
| DL | Inhibit Info \| 1st \| 2nd \| ... \| last state 3BL) |
| D1 | Lower Page |
| D2 | Middle Page |
| D3 | / |
| DC | Upper Page |

FIG. 11

| Latch | Latched Information |
|---|---|
| DS | (Inhibit Information \| 1st \| 2nd \|... \| last state PV pass) |
| DL | Inhibit Info \| 1st \| 2nd \| ...\| last state 3BL) |
| D1 | Lower Page |
| D2 | Middle Page |
| D3 | / |
| DC | Upper Page |

FIG. 12

| Latch | Latched Information |
|---|---|
| DS | Inhibit Information → 3BL |
| DL | ( 1st | 2nd | ...| last state 3BL) |
| D1 | Lower Page |
| D2 | Middle Page |
| D3 | / |
| DC | Upper Page |

FIG. 13

ARCHITECTURE AND METHOD FOR NAND MEMORY PROGRAMMING

RELATED APPLICATION

This application is a bypass continuation of International Application No. PCT/CN2020/117315, filed on Sep. 24, 2020. The entire disclosure of the prior application is hereby incorporated by reference in its entirety.

BACKGROUND

Flash memory devices have recently been through a rapid development. The flash memory devices are able to retain the stored data for a long period of time without applying a voltage. Further, the reading rate of the flash memory devices is relatively high, and it is easy to erase stored data and rewrite data into the flash memory devices. Thus, the flash memory devices have been widely used in microcomputers, automatic control systems, and the like. To increase the bit density and reduce the bit cost of the flash memory devices, three-dimensional (3D) NAND (Not AND) flash memory devices have been developed.

As the performance and complexity of electronic systems increase, the requirement for additional memory in a system also increases. However, in order to continue to reduce the costs of the system, the number of parts must be kept to a minimum. This can be accomplished by increasing the memory density of an integrated circuit by using such technologies as triple level cells (TLC). For example, TLC NAND flash memory is a very cost effective non-volatile memory. Triple level cells take advantage of the analog nature of a traditional flash cell by assigning a bit pattern to a specific threshold voltage (Vt) range stored on the cell. This technology permits the storage of three bits per cell, depending on the quantity of voltage ranges assigned to the cell and the stability of the assigned voltage ranges during the lifetime operation of the memory cell.

SUMMARY

In the present disclosure, embodiments directed to an apparatus and a method for programming triple level cells of a 3D-NAND memory device based on an algorithm that enables a non-destructive mode program in a page buffer with a reduced number of latches.

According to an aspect of the present disclosure, a method of programming a memory device is provided, where the memory device can include a cache structure and memory cells. In the method, inhibit information can be stored to first latch structures and second latch structures of the cache structure. A first state programming voltage can be applied to data lines of the memory cells to program the memory cells to a first state. A first state verification voltage can be applied to the data lines of the memory cells to perform a first state verification operation on the memory cells. The first state verification operation can verify first state threshold voltages of the memory cells based on a first target value and also generate failure pattern data of the first state verification operation. The failure pattern data can be stored to the second latch structures and indicate a first portion of the memory cells that passes the first state verification operation and a second portion of the memory cells that fails the first state verification operation. Further, a first state adjusted verification voltage can be applied to the data lines of the second portion of the memory cells that fails the first state verification operation to perform a first state adjusted verification operation on the second portion of the memory cells. The first state adjusted verification operation can verify the first state threshold voltages of the second portion of the memory cells to which the first state adjusted verification voltage is applied.

In the method, the first state programming voltage can be applied to the data lines of the memory cells to program the memory cells to the first state based on a counter value of a verification state counter being less than a first value. The first value for the counter value of the verification state counter can be eight, and the counter value of the verification state counter can indicate which state of the memory cells is programmed.

In order to apply the first state programming voltage to the bit lines of the memory cells, an initial first state programming voltage can be determined according to the inhibit information stored in the first latch structures and the counter value. The inhibit information can be replaced with initial adjusted verification information (or 3BL information) in the first latch structures. The first state programming voltage can be determined based on the initial first state programming voltage and the initial adjusted verification information. The initial adjusted verification information can indicate which of the memory cells receive a previous adjusted verification voltage in a previous adjusted verification operation prior to the first state adjusted verification operation.

In some embodiments, before the first state verification voltage is applied, the inhibit information can be inverted in the first latch structures to form inverted inhibit information, where the inverted inhibit information can indicate unverified states of the memory cells that include the first state and remaining states subsequent to the first state.

In some embodiments, when the inhibit information is stored to first latch structures and second latch structures of the cache structure, lower page information of the memory cells can be stored to third latch structures of the cache structure, middle page information of the memory cells can be stored to fourth latch structures of the cache structure, and upper page information of the memory cells can be stored to fifth latch structures of the cache structure.

In the method, after the first state verification operation is performed, first state failure verification information can be added to the first latch structures, where the first state failure verification information can indicate the second portion of the memory cells that fails the first state verification operation.

In the method, after the first state adjusted verification operation is performed, the inhibit information and first state adjusted verification information can be stored to the second latch structures, where the first state adjusted verification information indicates which of the memory cells receive the first state adjusted verification voltage.

In the method, after the first state verification operation is performed, the counter value of the verification state counter can be incremented in response to a failure rate of the failure pattern data being equal to or less than a second value.

In the method, after the first state adjusted verification operation is performed, a second state verification voltage can be applied to the data lines of the memory cells and performing a second state verification operation on the memory cells to verify a second state threshold voltage of the memory cells based on a second target value. Further, a second state adjusted verification voltage can be applied to the data lines of a portion of the memory cells that fails the second state verification operation so that a second state adjusted verification operation can be performed on a portion of the memory cells that fails the second state verification operation.

Further, second state failure verification information can be added to the first latch structures. The second state failure verification information can be obtained from the second state verification operation and indicate the portion of the memory cells that fails the second state verification operation. In addition, second state adjusted verification information can be added to the second latch structures, where the second state adjusted verification information can indicate which of the memory cells receive the second state adjusted verification voltage.

Subsequently, the inhibit information, first state pass verification information, and second state pass verification information can be stored to the first latch structures, where the first state pass verification information is obtained from the first state verification operation and indicates the first portion of the memory cells that passes the first state verification operation, and the second state pass verification information indicates a portion of the memory cells that passes the second state verification operation. A determination can be made to determine whether the counter value of the verification level counter is greater than or equal to the first value. In response to the determination that the counter value of the verification state counter is less than the first value, in an embodiment, the memory cells can be programmed and verified for the first state when the counter value of the verification state counter is unchanged. In another embodiment, the memory cells can be programmed and verified for a subsequent state to the first state in response when the counter value of the verification state counter is increased by one.

In the method, in order to program the memory cells for the subsequent state to the first state, an initial subsequent state programming voltage can be determined according to the inhibit information stored in the first latch structures. The inhibit information can subsequently be replaced with adjusted verification information that includes the first state adjusted verification information and the second state adjusted verification information in the first latch structures. A subsequent state programming voltage can be determined based on the initial subsequent state programming voltage and the adjusted verification information. The subsequent state programming voltage can further be applied on the data lines of the memory cells to program the memory cells in the subsequent state to the first state.

In the method, in order to verify the memory cells for the subsequent state to the first state, a subsequent state verification voltage can be applied to the data lines of the memory cells to perform a subsequent state verification operation on the memory cells. The subsequent state verification operation can verify a subsequent state threshold voltage of the memory cells based on a subsequent target value and generate failure pattern data of the subsequent state verification operation. The failure pattern data can be stored to the second latch structures and indicate a first portion of the memory cells that passes the subsequent state verification operation and a second portion of the memory cells that fails the subsequent state verification operation. Further, a subsequent state adjusted verification voltage can be applied to the data lines of the second portion of the memory cells that fails the subsequent state verification operation to perform a subsequent state adjusted verification operation on the second portion of the memory cells, where the subsequent state adjusted verification operation can verify the subsequent state threshold voltage of the second portion of the memory cells to which the subsequent state adjusted verification voltage is applied.

According to another aspect of the disclosure, a memory device is provided. The memory device can include a plurality of memory cells, and a cache structure that includes data line bias circuits and page buffers. The data line bias circuits can be coupled to data lines of the memory cells and configured to apply bias voltages to the data lines. The page buffers can include first latch structures and second latch structures. Each of data line bias circuits can be coupled to a respective data line, and each of the page buffers can include a respective first latch structure and a respective second latch structure. The memory device can also include control circuitry coupled to the data lines of the memory cells, the first latch structures, and the second latch structures. The control circuitry can be configured to store inhibit information to the first latch structures and the second latch structures. The control circuitry can be configured to apply a first state programming voltage through the data line bias circuits to data lines of the memory cells to program the memory cells to a first state.

The control circuitry can also be configured to apply a first state verification voltage through the data line bias circuits to the data lines of the memory cells to perform a first state verification operation on the memory cells. The first state verification operation can verify first state threshold voltages of the memory cells based on a first target value and generate failure pattern data of the first state verification operation, where the failure pattern data can be stored to the second latch structures and indicate a first portion of the memory cells that passes the first state verification operation and a second portion of the memory cells that fails the first state verification operation. The control circuitry can further be configured to apply a first state adjusted verification voltage through the data line bias circuit to the data lines of the second portion of the memory cells that fails the first state verification operation to perform a first state adjusted verification operation on the second portion of the memory cells. The first state adjusted verification operation can verify the first state threshold voltages of the second portion of the memory cells to which the first state adjusted verification voltage is applied.

In some embodiments, the page buffers can further include third latch structures that are configured to store lower page information of the memory cells, fourth latch structures that are configured to store middle page information of the memory cells, and fifth latch structures that are configured to store upper page information of the memory cells. Each of the page buffers can include a respective third latch structure, a respective fourth latch structure, and a respective fifth latch structure.

In some embodiments, the control circuitry can include a verification state counter that is configured to increment a counter value of the verification state counter in response to a failure rate of the failure pattern data being equal to or less than a second value. The counter value of the verification state counter can indicate in which state the memory cells are programmed.

The control circuitry can further be configured to apply a first state programming voltage to the data lines of the memory cells to program the memory cells to the first state based on the counter value of the verification state counter being less than a first value.

In order to program memory cells to the first level, the control circuitry can determine an initial first state programming voltage according to the inhibit information stored in the first latch structures and the counter value. The control circuitry can replace the inhibit information with initial adjusted verification information in the first latch structures, and determine the first state programming voltage based on the initial first state programming voltage and the initial adjusted verification information. The initial adjusted verification information can indicate which of the memory cells receive a previous adjusted verification voltage in a previous adjusted verification operation prior to the first state adjusted verification operation. The control circuitry can further apply the first state programming voltage through the data line circuits to the data lines of the memory cells for programing the memory cells to the first state.

In some embodiments, the control circuitry can invert the inhibit information in the first latch structures, where the inverted inhibit information indicates unverified states of the memory cells that include the first state and remaining states subsequent to the first state. The control circuitry can thus apply a first state verification voltage through the data line bias circuits to the data lines of the memory cells to perform the first state verification operation, where the first state verification voltage can be determined according to the inverted inhibit information stored in the first latch structures.

The cache structure can further include verification circuits, where each of the verification circuits is coupled to a respective data line, a respective first latch structure, and a respective second latch structure. The verification circuits can be configured to read the memory cells to which the first state verification voltage is applied to verify whether the first state threshold voltages of the memory cells meet a first target value. In addition, the failure pattern date of the first state verification operation can be stored to the second latch structures through the verification circuits.

BRIEF DESCRIPTION OF THE DRAWINGS

Aspects of the present disclosure can be understood from the following detailed description when read with the accompanying figures. It is noted that, in accordance with the standard practice in the industry, various features are not drawn to scale. In fact, the dimensions of the various features may be increased or reduced for clarity of discussion.

FIGS. 7-13 are schematic diagrams of various latch states when programming a memory, in accordance with exemplary embodiments of the disclosure.

DETAILED DESCRIPTION

Figure 1:
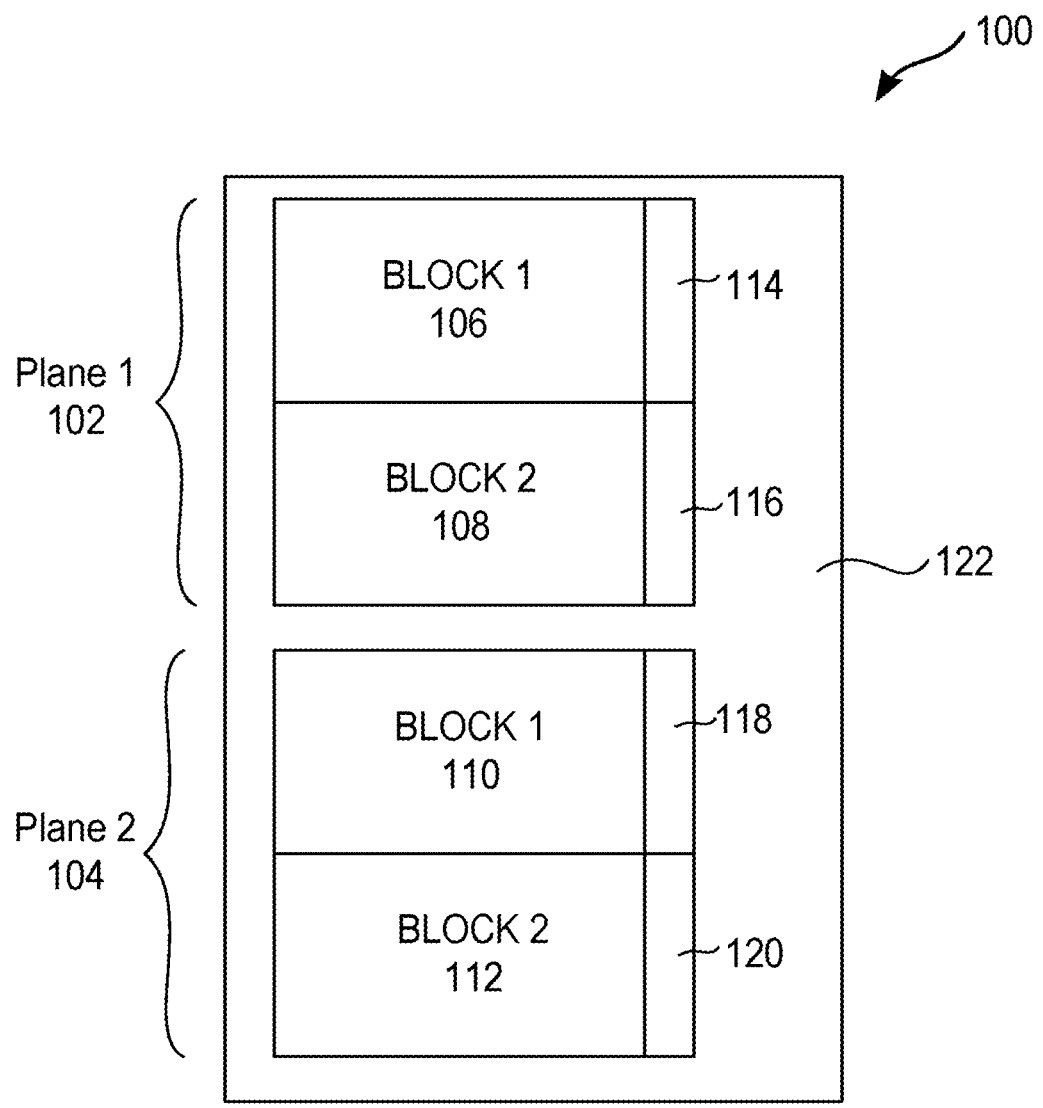
FIG. 1 is a schematic diagram of a 3D-NAND memory device, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A 3D-NAND device can include a plurality of planes. Each of the planes can include a plurality of blocks. FIG. 1 is an exemplary embodiment of a 3D-NAND device 100 (or device 100). As shown in FIG. 1, the device 100 can include planes 102 and 104. Each of the planes 102 and 104 can include two respective blocks. For example, the plane 102 can include two blocks 106 and 108, and the plane 104 can include two blocks 110 and 112. Further, each of the blocks can include a plurality of memory cell strings, where memory cells are disposed sequentially and in series over a substrate along a height direction of the device 100. It should be noted that FIG. 1 is merely an example, and the device 100 can include any number of planes, and each of the planes can include any number of blocks according to the device designs. In the device 100, each of the planes can be coupled to a respective cache structure, such as a dynamic data cache (DDC), or a static page buffer (SPB). For example, the block 106 can be coupled to a cache structure 114 and the block 108 can be coupled to a cache structure 116. The cache structure can include sense amplifiers that are coupled to bit lines and configured to sense signals during the operation of the 3D-NAND device 100. The cache structure can include a plurality of page buffers. Each of the page buffers can be coupled to a respective bit line, and includes a plurality of latches (or latch structures). The page buffers are configured to temporarily hold data when the 3D-NAND device 100 is operated. For example, when memory cells of the 3D-NAND device are triple level cells (TLCs), each of the page buffers can include six latches. The device 100 can also include periphery circuits 122 that can include decoder structures, driver structures, charge structures, and other structures to operate the memory cells.

Figure 2:
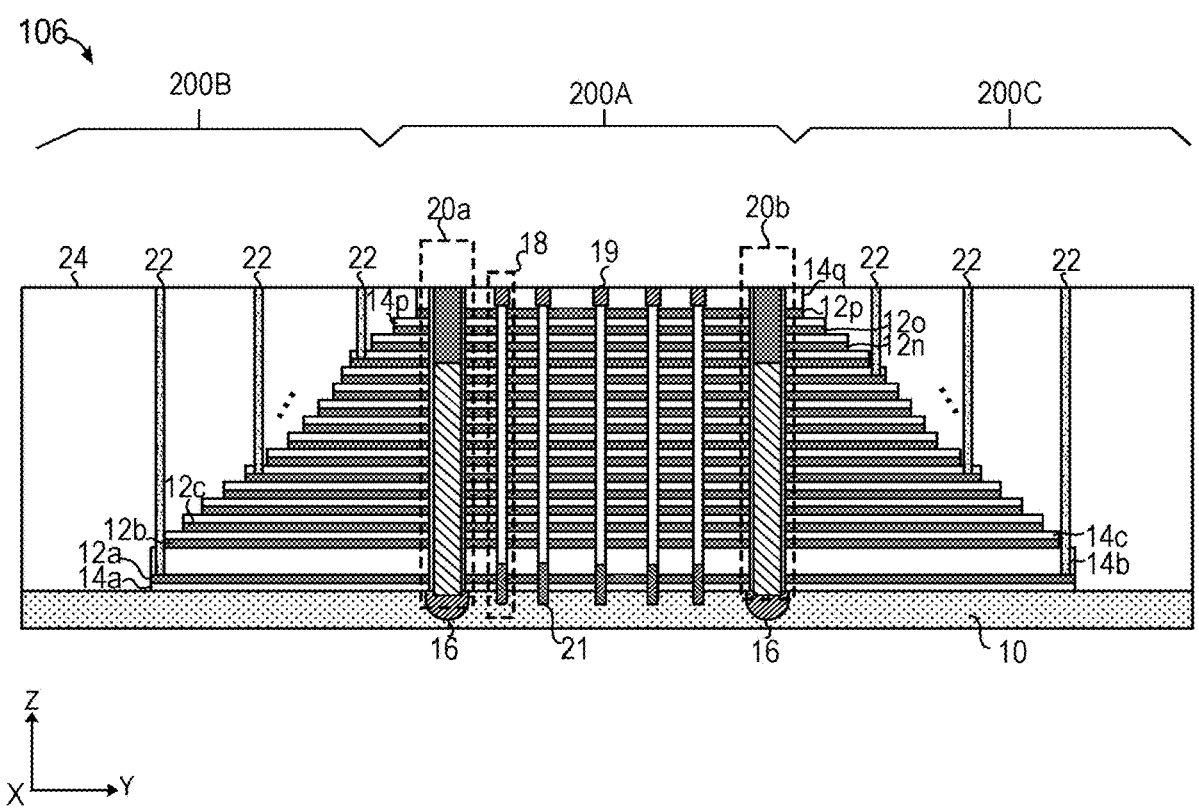
FIG. 2 is a cross-sectional view of a 3D-NAND memory device, in accordance with exemplary embodiments of the disclosure.

In the device 100, each of the blocks can include staircase regions and array regions that are formed in a stack of word line layers and insulating layers. FIG. 2 is an exemplary embodiment of the block 106 of the device 100. As shown in FIG. 2, the block 106 can include an array region 200A and staircase regions 200B-200C that are arranged in a dielectric layer 24. The array region 200A can be arranged between the staircase regions 200B-200C, and formed in a stack of alternating word line layers 12a-12p and insulating layers 14a-14q over a substrate 10. The word line layers 12a-12p can include one or more bottom select gate (BSG) layers, gate layers (or word line layers), and one or more top select gate (TSG) layers that are arranged sequentially over the substrate 10. For example, the word line layers 12o-12p can be the BSG layers, and the word line layers 12a-12b can be the TSG layers in the device 100. The array region 200A can include a plurality of channel structures 18. Each of the channel structures 18 can include a respective top channel contact 19 and a respective bottom channel contact 21. Each of the channel structure 18 can extend through the stack and be coupled to the word line layers 12a-12p to form a respective vertical NAND memory cell string. The vertical NAND memory cell string can include one or more bottom select transistors (BSTs), a plurality of memory cells (MCs), and one or more top select transistors (TSTs) that are disposed sequentially and in series over the substrate along a height direction (e.g., Z direction) of the substrate 10. The one or more BSTs can be formed of the channel structure and the one or more BSG layers, the MCs can be formed of the channel structure and the word line layers, and the one or more TSTs can be formed of the channel structure and the one or more TSG layers.

In the device 100, each of the memory cells can store one or more logic bits, according to the device designs. For example, the memory cells can be single level cells (SLCs), multiple level cells (MLCs), or triple level cells (TLCs). Accordingly, each of the memory cells can store one logic bit, two logic bits, or three logic bits.

Still referring to FIG. 2, the word line layers 12a-12p can be formed in a stair-cased configuration in the staircase regions 200A-200B, and a plurality of word line contacts 22 can be formed along the height direction and coupled to the word line layers 12a-12p. Thus, gate voltages can be applied on gates of the memory cells through the word line contact 22 that is coupled to the word line layers 12a-12p.

In addition, each of the channel structures can further be coupled to a respective bit line (or bit line structure). In some embodiments, the bit line can be connected to the top channel contact 19 of the channel structure 18, and configured to apply a bias voltage when operating the channel structure, such as programming, erasing, or reading the channel structure. The device 100 can have a plurality of slit structures (or gate line slit structures). For example, two slit structures 20a-20b are included in FIG. 2. The slit structures 20a-20b can be made of conductive materials and positioned on array common source (ACS) regions 16 to serve as contacts. The ACS regions are formed in the substrate 10 to serve as common sources of the device 100.

Figure 3:
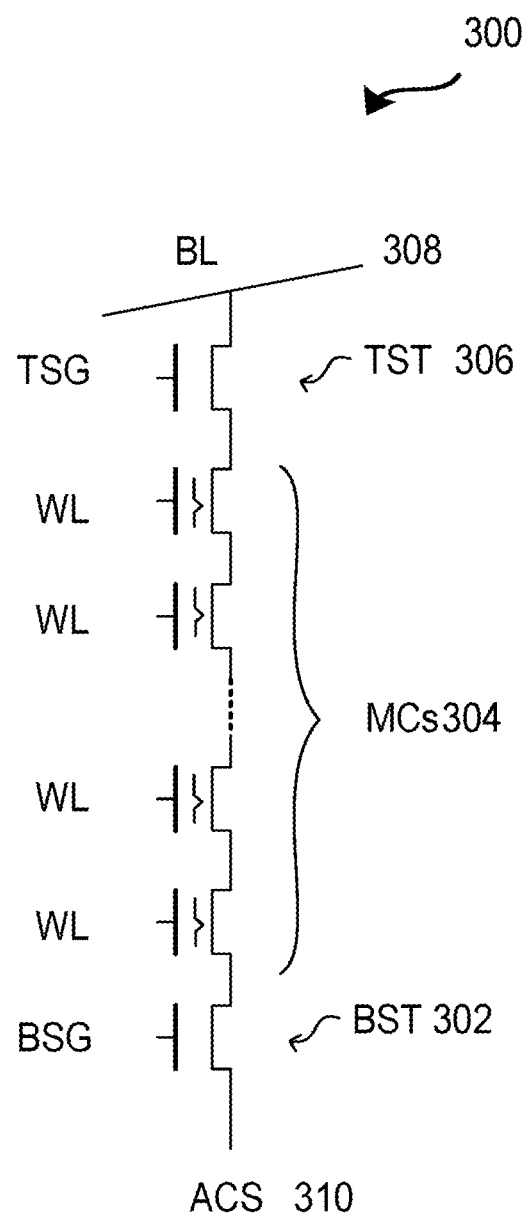
FIG. 3 is a schematic diagram of a NAND memory cell string, in accordance with exemplary embodiments of the disclosure.

FIG. 3 is a schematic view of a NAND memory cell string (or string) 300 that can be formed in the device 100. As shown in FIG. 3, the string 300 can include a bottom select transistor (BST) 302, a plurality of memory cells (MCs) 304, and a top select transistor (TST) 306 that are disposed sequentially and in series over the substrate along the height direction (e.g., Z direction) of the substrate 10. The string 300 can be coupled to a bit line 308 through a drain terminal of the TST 306, and coupled to an ACS 310 through a source terminal of the BST 302. During the operation of the device 100, appropriate voltages can be applied to the bit line 308, the gate of the TST 306 through the TSG layer, the gates of the MCs 304 through the WL layers, the gate of the BST 302 through the BSG layer, and the ACS 310 through the slit structure (e.g., 20a or 20b).

Figure 4:
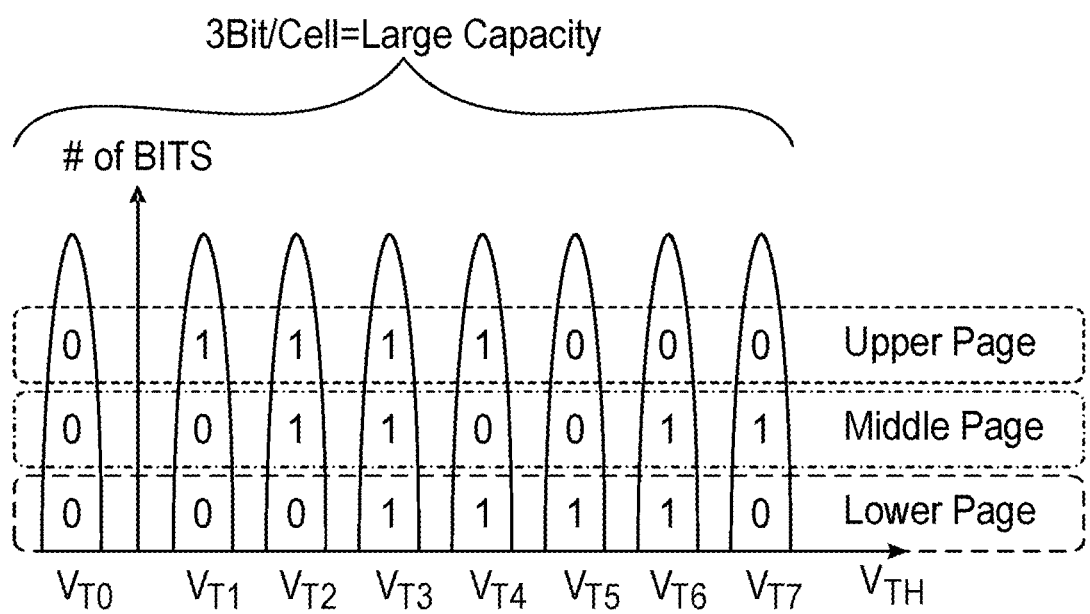
FIG. 4 is a schematic view of data storage in a triple level cell (TLC) of a 3D-NAND device, in accordance with exemplary embodiments of the disclosure.

As mentioned above, the memory cells can be single level cells, multiple level cells, triple level cells, or quad level cells that can store single logic bit, two logic bits, three logic bits, or four logic bits respectively. FIG. 4 is a schematic view of data storage in a triple level cell (TLC) of the 3D-NAND device. As shown in FIG. 4, the TLC can have eight threshold voltages $V_{t0}$-$V_{t7}$ (or eight levels LV0-LV7), and each of the eight threshold voltages $V_{t0}$-$V_{t7}$ can represent three corresponding logic bits. For example, the first threshold voltage (or first level LV0) $V_{t0}$ corresponds to logic bits 000, and the second threshold voltage (or second level LV1) $V_{t1}$ corresponds to logic bits 100. Thus, by adjusting a threshold voltage of the TLC to a target value (or target threshold voltage), the TLC can be programmed (or written) with corresponding logic bits. When the programming operation of the TLC is completed, a subsequent verification operation can be performed to verify whether the threshold voltage of the TLC meets the target value. The logic bits stored in the TLC can further be divided into three logic pages that are a lower page, a middle page and an upper page. For example, logic bits 100 of the second level LV1 of the TLC can further be stored in the lower page, the middle page, and the upper page, where the logic bit 1 can be stored in the upper page, the first logic bit 0 can be stored in the middle page, and the second logic bit 0 can be stored in the lower page. Information in each of the logic pages (e.g., lower page information, middle page information, and upper page information) can represent a respective entity, such as a song, or a picture. In some embodiments, information in each of the logic pages can be temporally stored in a corresponding latch during the programming operation.

When the 3D-NAND device is programmed according to related methods, three latches of the page buffer can be used to store the original data (or processed data) throughout the entire programming operation. In addition, one specific latch (also referred to as an inhibit latch) can be reserved to store inhibit information, one latch can be used for sensing/programming, and one latch can be applied for storing 3BL (3 bit line) information. In the disclosure, a sensing scheme, which is called as non-inhibit verification, is provided for the programming operation of the 3D-NAND device. In the non-inhibit verification, a page buffer that includes five latches can be applied. Accordingly, a number of latches, such as the six latches applied in related methods, can be reduced. In addition, in the non-inhibit verification, less page buffer operations can be applied when verification states are switched.

Figure 5:
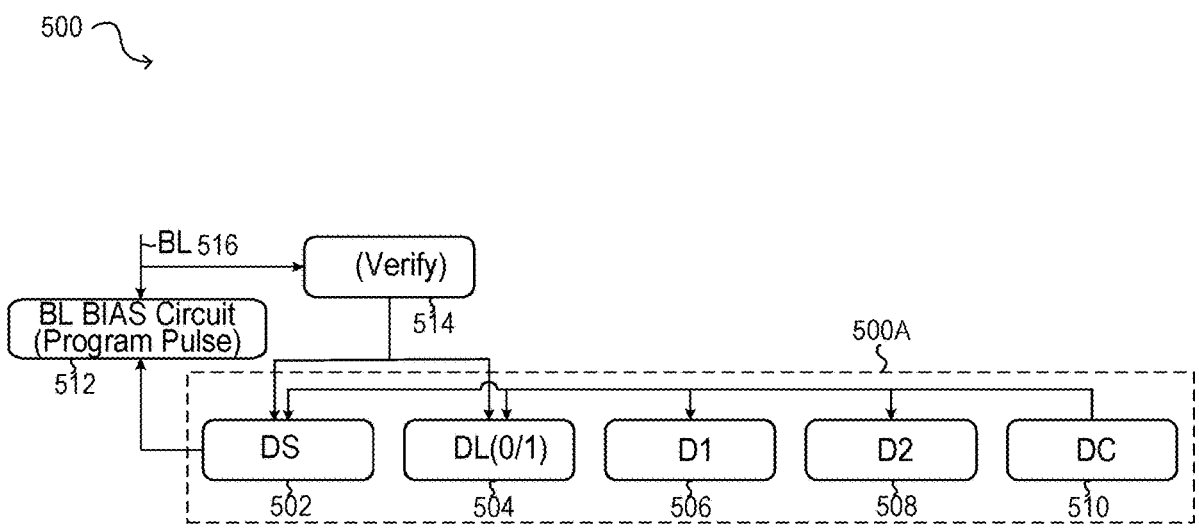
FIG. 5 is an exemplary block schematic of a circuit of a 3D-NAND, in accordance with exemplary embodiments of the disclosure.

FIG. 5 is an exemplary block schematic of a circuit 500 that is utilized in the programming operation. As shown in FIG. 5, the circuit 500 can include a page buffer 500A. The page buffer 500A can include a DS latch (or first latch) 502 configured to store inhibit information and verification information from the verification operation, a DL latch (or second latch) 504 configured to store inhibit information and 3BL information (or adjusted verification information from an adjusted verification operation), a D1 latch (or third latch) 506 configured to store lower page information of the memory cells during the programming operation, a D2 latch (or fourth latch) 508 configured to store middle page information of the memory cells, and a DC latch (or fifth latch) 510 configured to store upper page information of the memory cells. The DS latch 502, the DL latch 504, the D1 latch 506, the D2 latch 208, and the DC latch 210 can further be coupled to each other and share data with each other. In some embodiments, the latches in the page buffer 200A can be formed of cross-coupled logic inverters.

The circuit 500 can also include a bit line (BL) bias circuit 512 that is coupled to the DS latch 502. The BL bias circuit 512 can further be coupled to a bit line (BL) 516 and apply bias voltage to the BL 516 according to the inhibit information stored in the DS latch 502. During the programming operation, a programming voltage can be applied to the BL 516 through the BL bias circuit 512. The programming voltage can further be applied to the memory cells through the BL 516 for programming the memory cells. During the verification operation, a verification voltage can be applied to the BL 516 through the BL bias circuit 512. The verification voltage can further be applied to the memory cells through the BL 516 for the verification operation. The circuit 500 can also include a verification circuit 514, such as a sense amplifier, that is coupled to the BL 516, the DS latch 502, and the DL latch 504. The verification circuit 514 can be configured to read the memory cells during the verification operation to verify whether the threshold voltages of the memory cells meet a target value. If the threshold voltages of the memory cells meet the target value, it indicates that the memory cells pass the verification operation. If the threshold voltages of the memory cells do not meet the target value, it indicates that the memory cells fail the verification operation. When the threshold voltages of the memory cells do not meet the target value, an adjusted verification voltage can be applied to the memory cells through the BL 516 to verify whether the threshold voltages of the memory cells can meet an adjusted value.

The verification circuit 514 can further generate a failure pattern data (also referred to as verify failure counter (VFC)) that indicates which of the memory cells fails the verification operation. The verification circuit 514 can further transmit verification information to the DS latch 502 and/or DL latch 504. The circuit 500 can also include a verification level counter (not shown) that is configured to increment a counter value, for example increase a counter value of the verification level counter by one, in response to a failure rate of the failure pattern data being equal to or less than a standard value, such as 10%. The counter value of the verification level counter can indicate in which level the memory cells are programmed.

It should be noted that the 3D-NAND device (e.g., device 100) can include a plurality of circuits 500 that are arranged in the cache structures (e.g., 114, 116), and each of the circuits 500 can be coupled to a respective bit line of the 3D-NAND device and be utilized in the programming operation.

Figure 6:
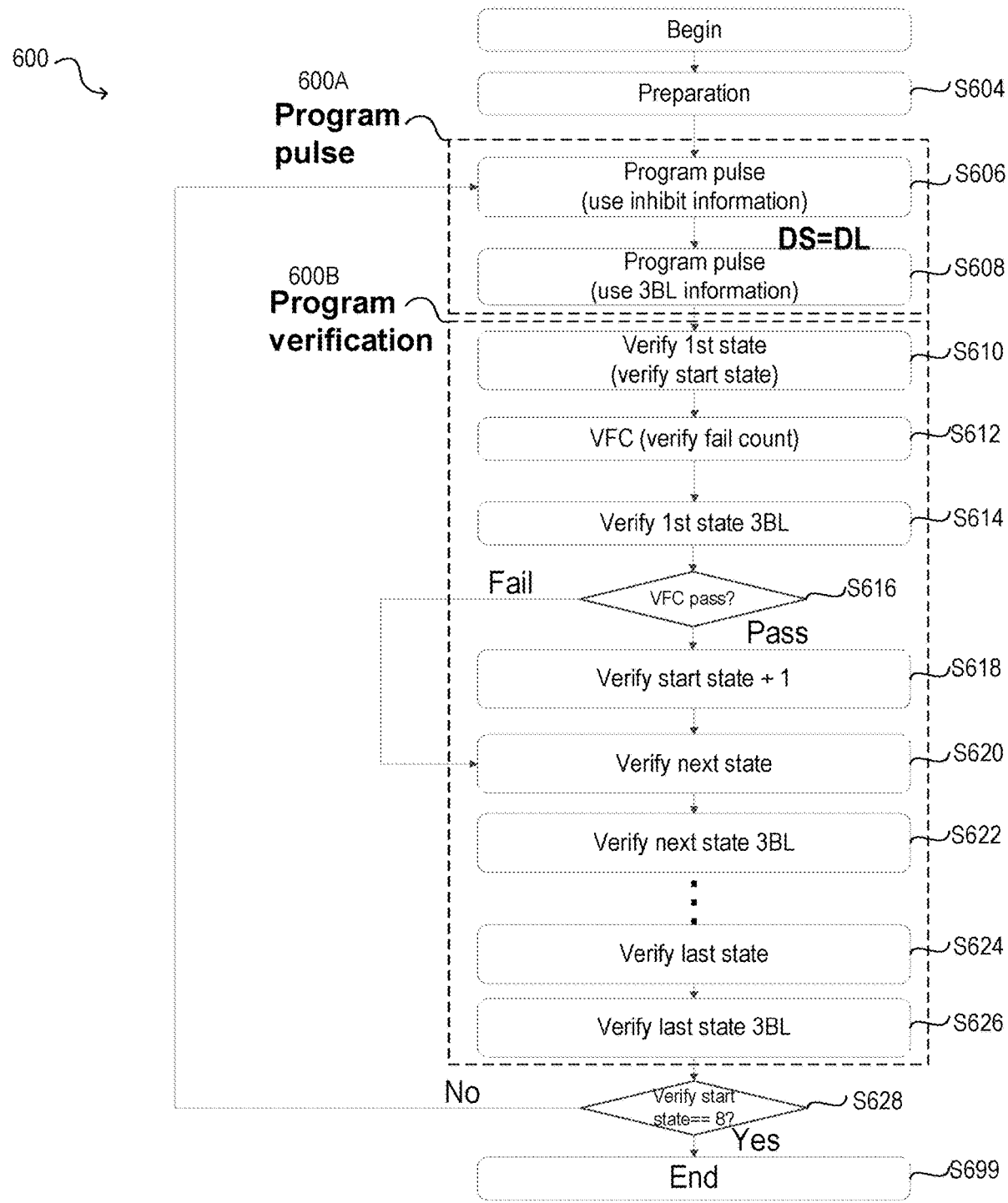
FIG. 6 is a flow chart diagram of a method for memory programming, in accordance with exemplary embodiments of the disclosure.

FIG. 6 is a flow chart diagram of a method 600 for memory programming, in accordance with exemplary embodiments of the disclosure. As shown in FIG. 6, the method 600 can include program pulse operation 600A that is configured to program memory cells of a 3D NAND device (e.g., device 100), and program verification operation 600B that is configured to verify whether the memory cells are programmed to target threshold voltages. As shown in FIG. 6, the method 600 can begin at step S604, where a preparation can be performed. In the preparation, the memory cells can be erased to receive new data, and inhibit information can be set (or stored) in first latches (e.g., DS latch 502) and second latches (e.g., DL latch 504). The inhibit information can be formed of logic 1 and logic 0, where the logic 1 indicates not to program the memory cells, and the logic 0 indicates to program the memory cells.

The method 600 can then proceed to step S606 which is a first step of the program pulse operation 600A. At step S606, an initial first state programming voltage can be determined according to the inhibit information set in the first latches (e.g., DS latch 502) and the counter value of the verification state counter. In an exemplary embodiment of the method 600, the first state can be the third level LV2 of the memory cells, and thus the counter value of the verification state counter is two. The method 600 can then proceed to step S608 which is a second step of the program pulse operation 600A. At step S608, the inhibit information in the first latches (e.g., DS latch 502) can subsequently be replaced with initial adjusted verification information (3BL information) that was stored in the second latches (e.g., DL latch 504), where the initial adjusted verification information indicates which of the memory cells receive a previous adjusted verification voltage in a previous adjusted verification operation from a prior state (e.g. the second level LV1) to the first state (e.g., the third level LV2). A first state programming voltage can then be determined based on the initial first state programming voltage and the initial adjusted verification information, and applied to the data line (e.g., the word line, or bit line) of the memory cells for programing the memory cells to the first state (e.g., LV2).

The method 600 can proceed to step S610 to start the program verification operation 600B. At step S610, a first state verification voltage can be applied to the data lines of the memory cells to perform a first state verification (or a first state verification operation) on the memory cells, where the first state verification can verify first state threshold voltages of the memory cells based on a first target value and further generate failure pattern data (or VFC) of the first state verification. In an exemplary embodiment of FIG. 6, the first state is the third level LV2 of the memory cells, and the first state threshold voltages are accordingly $V_{t2}$. The failure pattern data can be set (transmitted, stored, or saved) to the second latch structures (e.g., DL latch 504) and indicate a first portion of the memory cells that passes the first state verification and a second portion of the memory cells that fails the first state verification. In some embodiments, before the first state verification, the inhibit information in the first latch structures can be inverted, and the inverted inhibit information indicates unverified states of the memory cells that include the first state (e.g., the third level LV2) and remaining states subsequent to the first states (e.g., LV3-LV7). In some embodiments, first state failure verification information can be added to the first latch structures (e.g., DS latch 502), where the first state failure verification information indicates the second portion of the memory cells that fails the first state verification.

At step S612, failure pattern data can be counted to calculate a failure rate of the failure pattern data.

At step S614, a first state adjusted verification voltage can be applied to the data lines of the second portion of the memory cells that fails the first state verification to perform a first state adjusted verification (or a first state adjusted verification operation) on the second portion of the memory cells. In some embodiments, the inhibit information and first state adjusted verification information (or 3BL information) can be set to the second latch structures. The first state adjusted verification information indicates which of the memory cells receive the first state adjusted verification voltage.

At step S616, a determination can be made based on failure rate of the failure pattern data. In response to the determination that the failure rate of the failure pattern data is equal to or less than a standard value (i.e., Pass at step S616), the method 600 can proceed to S618, where the counter value of the verification state counter can be increased by one, and then proceed to step S620. In response to the determination that the failure rate of the failure pattern data is larger than the standard value (i.e., Fail at step S616), the method 600 proceeds to step S620 directly.

At step S620, a second state verification voltage can be applied to the data lines of the memory cells to perform a second state verification (or second state verification operation) on the memory cells to verify a second state threshold voltage of the memory cells based on a second target value. In an exemplary embodiment of FIG. 6, when the first state is LV2, the second state is thus LV3, and the second state threshold voltage is accordingly $V_{t3}$. At step S622, a second state adjusted verification voltage can be applied to the data lines of a portion of the memory cells that fails the second state verification to perform a second state adjusted verification (or a second state adjusted verification operation) on the portion of the memory cells that fails the second state verification. As shown in steps S624 and S626, the verification operation and adjusted verification operation can be repeated for remaining states (e.g., LV4-LV7) of the memory cells until the verification and adjusted verification are completed for a last state (e.g., LV7). In some embodiments, failure verification information for the first state (e.g., LV2) and the states (e.g., LV3-LV7) subsequent to the first state can be set to the first latch structures (e.g., DS latch 502), and adjusted verification information for the first state and the states subsequent to the first state can be set to the second latch structures (e.g., DL latch 504).

The method 600 then proceeds to step S628, where a determination can be made to determine whether the counter value of the verification state counter is equal to the threshold value (e.g., eight) or less than the threshold value. As mentioned above, the counter value of the verification state counter indicates which state of the memory cells is to be programmed and verified. When the counter value of the verification state counter is equal to eight (e.g., Yes at S628), it indicates that the first state that is programmed and verified is the eighth level LV7 of the memory cells, and the eighth level LV7 is also successfully programmed. Thus the method 600 proceeds to step S699 because all levels (LV0-LV7) of the memory cells are programmed successfully. When the counter value of the verification state counter is less than eight (e.g., No at S628), it indicates that the first state is not the eighth level LV7 of the memory cells, and the method 600 needs to proceed to program and verify a next state that is indicated by the counter value of the verification state counter. For example, when the counter value of the verification state counter is three, the next state that needs to be programmed and verified is the fourth level LV3 of the memory cells.

As shown in S628, in response to the counter value being less than eight, the memory cells are programmed and verified for the next state. In an embodiment, the next state is still the first state in response to the counter value of the verification state counter being unchanged. In another embodiment, the next state is a subsequent state to the first state in response to the counter value of the verification state counter being increased by one at step S618. In order to program the next state of the memory cells, an initial programming voltage is determined according to the inhibit information set in the first latch structures. Further, the inhibit information in the first latch structures can be replaced with adjusted verification information in the first latch structures. The adjusted verification information indicates which of the memory cells receive the first state adjusted verification voltage in the first state adjusted verification operation. A programming voltage thus can be determined based on the initial programming voltage and the adjusted verification information, and the programming voltage can be applied on the data lines of the memory cells to program the memory cells in the subsequent state (e.g., LV3) to the first state (e.g., LV2).

Table 1 shows a relationship of a verification level and verification content when the programming operation and the verification operation begin at the second level (e.g., LV1) of the memory cells.

TABLE 1 a relationship of a verification level and verification content

| Verification level | LV1 | LV2 | LV3 | LV4 | LV5 | LV6 | LV7 |
|---|---|---|---|---|---|---|---|
| Verfication Content | LV1~LV7 | LV1 Fail + LV2~LV7 | LV1 Fail + LV2 Fail + LV3~LV7 | (LV1~LV3) Fail + LV4~LV7 | (LV1~LV4) Fail + LV5~LV7 | (LV1~LV5) Fail + LV6~LV7 | (LV1~LV6) Fail + LV7 |

As shown in Table 1, when the second level (LV1) is a first state that is programmed and verified, the verification operation can verify the second level (LV1) to the eighth level (LV7). For a remaining state to the first state, the verification operation can verify the memory cells that fail in the previous states of the remaining state again in the previous states, and the memory cells from the remaining state to a last state (e.g., the eighth level LV7). For example, when the third level (e.g., LV2) is programmed and verified, the verification operation can verify memory cells that fail in the second level (e.g., LV1 fail) again in the second level (e.g., LV1), and verify the memory cells from the third level (e.g., LV2) to the last level (e.g., LV7). When the fourth level (e.g., LV3) is programmed and verified, the verification operation can verify memory cells that fail in the second level (e.g., LV1 fail) again in the second level (e.g., LV1), the memory cells that fail in the third level (e.g., LV2 fail) again in the third level (e.g., LV2), and the memory cells from the fourth level (e.g., LV3) to the eighth level (e.g., LV7).

FIGS. 7-13 are schematic diagrams of various latch states when programming a 3D-NAND memory device based on the method described above. As mentioned in FIG. 6, in order to program the 3D-NAND device, a preparation operation (e.g., S604 in FIG. 6) can be applied first. Subsequently, a programming operation (e.g., 600A in FIG. 6) can be applied to program (or write) the memory cells of the 3D-NAND device. Further, a verification operation (e.g., 600B in FIG. 6) can be applied to verify whether the memory cells are programmed successfully. FIG. 7 shows the latch states of the latches when a preparation operation (e.g., S604) is performed. As mentioned above, the 3D-NAND device can include memory cells that are formed of a plurality of vertical NAND memory cell strings. Each of the vertical NAND memory cell strings can be coupled to a respective bit line, and the bit line can further be coupled to a respective page buffer that include latches as shown in FIG. 5. In the preparation operation, the memory cells can be erased to receive to-be-programmed data, and inhibit information can be set (stored or saved) in DS latches (e.g., DS latch 502) and DL latches (e.g., DL latch 504). The inhibit information can be indicated by logic 1 and logic 0. For example, the logic 1 indicates that the memory cells are not to be programmed, and the logic 0 indicates that the memory cells are to be programmed. In addition, user data that is programmed in the memory cells can be stored in D1 latches, D2 latches, and DC latches. The D1 latches can save lower page information of the memory cells, the D2 latches can save middle page information of the memory cells, and the DC latches can save upper page information of the memory cells. When the preparation operation (e.g., S604 in FIG. 6) is completed, a program pulse (or programming voltage) can be applied to gates of the memory cells through BL bias circuits (e.g., BL bias circuit 512) to program the memory cells that can be shown in program pulse 600A of FIG. 6. For example, the memory cells can be programmed to a first state. In an exemplary embodiment of FIG. 7, the first state is the third level LV2 of the memory cells.

FIG. 8 shows the latch states of the latches before the first state verification operation (e.g., S610 in FIG. 6) is performed. As shown in FIG. 8, the inhibit information in the DS latches can be inverted, where the inverted inhibit information (e.g., ~inhibit information) can indicate unverified states of the memory cells. In an exemplary embodiment of FIG. 8, the inverted inhibit information indicates that the first state to be verified is the third level LV2 of the memory cells. In addition, the inverted inhibit information indicates that remaining states subsequent to the first state are LV3-LV7, and the first level LV0 and the second level LV1 of the memory cells pass the verification operation. Thus, ~inhibit information can also be defined as (LV0|LV1) (i.e., not LV0 or not LV1).

FIG. 9 shows the latch states of the latches when the first state verification operation (e.g., S610 in FIG. 6) is performed on the memory cells, where a first state verification voltage can be applied to the data lines (e.g., BL 516) of the memory cells and further be coupled to the gates of the memory cells to perform the first state verification operation (or first state verification). The first state verification verifies whether first state threshold voltages of the memory cells meet the first target value (e.g., $V_{t2}$) when LV2 is the first state. The first state verification voltage can be a pulsed voltage signal that has an intensity close to the first target value. If the memory cells are turned on under the first state verification voltage, it can indicate that the threshold voltages of the memory cells do not meet the first target value and fail the first state verification. If the memory cells are not turned on under the first state verification voltage, it can indicate that the threshold voltages of the memory cells meet the first target value and pass the first state verification. In addition, verify failure counter (VFC) of the first state verification can be generated and set (saved, stored, or provided) to the DL latches (e.g., 504). The verify failure counter can include failure pattern data and indicate a first portion of the memory cells that passes the first state verification and a second portion of the memory cells that fails the first state verification. Further, first state failure verification information (e.g., $1^{st}$ state PV pass) can be added to the DS latches. The first state failure verification information indicates the second portion of the memory cells that fails the first state verification.

FIG. 10 shows the latch states of the latches when a first state adjusted verification (e.g., S614 in FIG. 6) is performed, where a first state adjusted verification voltage can be applied to the data lines of the second portion of the memory cells that fails the first state verification to perform the first state adjusted verification on the second portion of the memory cells. In some embodiments, an intensity of the first state adjusted verification voltage can be set lower than the first state verification voltage. The first state adjusted verification voltage can be obtained by subtracting a delta voltage from the first state verification voltage. The delta voltage can be less than 1 volt, and can be named as a 3BL bias. Thus, the first state adjusted verification can also be referred to as the first state 3BL or first state 3BL verification. The first state adjusted verification voltage can verify whether the first state threshold voltages of the second portion of the memory cells can meet a first adjusted target value that is lower than the first target value. Further, the inhibit information and first state adjusted verification information (or $1^{st}$ state 3BL information) that is obtained from the first state adjusted verification can be set to the DL latches (e.g., 504), where the first state adjusted verification information indicates which of the memory cells receive the first state adjusted verification voltage, and the inhibit information indicates the verified states (e.g., the first level LV0 and the second level LV1).

It should be noted that, as shown in S616 and S618 of FIG. 6, when the first state adjusted verification is completed, the counter value of the verification state counter can be incremented, for example increased by one, in response to a failure rate of the failure pattern data (VFC) being equal to or less than a standard value. When the failure rate of the failure pattern data is equal to or less than the standard value, it indicates that the memory cells are programmed successfully for the first state (e.g., the third level LV2).

FIG. 11 shows the latch states of the latches when the remaining states (e.g., from the fourth level to the eighth level LV3-LV7) subsequent to the first state (e.g., LV2) are verified sequentially that can be shown in S620-S626 in FIG. 6. Similar to the first state, each of the remaining states can receive a corresponding verification and a corresponding adjusted verification. In addition, failure verification information for each of the remaining states can be set to the DS latches, and adjusted verification information for each of the remaining states can be set to the DL latches.

For example, a second state verification voltage can be applied to the data lines of the memory cells and a second state verification can be performed on the memory cells to verify a second state threshold voltage (e.g., $V_{t3}$) of the memory cells based on a second target value. Subsequently, a second state adjusted verification voltage can be applied to the data lines of a portion of the memory cells that fails the second state verification and a second state adjusted verification can be applied on the portion of the memory cells that fails the second state verification. In addition, second state failure verification information (e.g., ~2nd state PV pass) can be added to the DS latches, where the second state failure verification information is obtained from the second state verification and indicates the portion of the memory cells that fails the second state verification. Further, second state adjusted verification information (e.g., $2^{nd}$ state 3BL) can be added to the DL latch structures, where the second state adjusted verification information indicates which of the memory cells receive the second state adjusted verification voltage.

As shown in FIG. 11, when the remaining states (e.g., from the fourth level to the eighth level LV3-LV7 of the memory cells) are verified sequentially, the inverted inhibit information and the failure verification information for all verified states (e.g., ~(inhibit information|$1^{st}$|2nd| . . . |last state PV pass) can be set to the DS latches, and the inhibit information and the adjusted verification information (e.g., inhibit information|$1^{st}$|2nd| . . . |last state 3BL) for all verified states can be set to the DL latches. When the remaining states are all verified, it indicates that the memory cells are programmed to the first state (e.g., LV2).

In FIG. 12, the inverted inhibit information and the failure verification information for all verified states (e.g., ~(inhibit information|$1^{st}$|2nd| . . . |last state PV pass) that is set in the DS latches can be inverted to form the inhibit information and pass verification information for all verified states. Accordingly, the inhibit information and the pass verification information for all verified states is set (or stored) to the DS latches. In addition, whether the counter value of the verification state counter is greater than or equal to the threshold value can be determined. In an exemplary embodiment of FIG. 12, the threshold value can be eight, which indicates that the memory cells have eight levels (e.g., LV0-LV7). When the counter value of the verification state counter is eight, it indicates that the eighth level (e.g., LV7) of the memory cells passes the verification operation. In response to the determination that the counter value of the verification state counter is less than the threshold value, in an embodiment, the memory cells can be programmed and verified for the first state (e.g., LV2) again in response to the counter value of the verification state counter being unchanged. The memory cells can be programmed and verified for a subsequent state (e.g., LV3) to the first state in response to the counter value of the verification state counter being incremented (e.g., increased by one).

FIG. 13 shows the latch states of the latches when the memory cells are programmed for a next state according to the counter value of the verification level counter. As mentioned above, when the counter value of the verification state counter is not changed after the first state verification, the next state is still the first state (e.g., LV2) and the memory cells are programmed for the first state again. When the counter value of the verification level counter is changed after the first state verification, the next state is a subsequent state (e.g., LV3) to the first state (e.g., LV2) and the memory cells are programmed for the subsequent state. In order to program the next state, an initial programming voltage can be determined according to the inhibit information set in the DS latches. Further, the inhibit information can be replaced with the adjusted verification information (e.g., inhibit information|$1^{st}$|2nd| . . . |last state 3BL) set (or stored) in the DL latches. A programming voltage can then be determined based on the initial programming voltage and the adjusted verification information. For example, the programming voltage can be determined by subtracting a delta voltage from the initial programming voltage according to the adjusted verification information. The programming voltage can thus be applied on the data lines (e.g., BL 516) of the memory cells and further coupled to the gates of the memory cells to program the memory cells for the next state (e.g., LV3).

Figure 14:
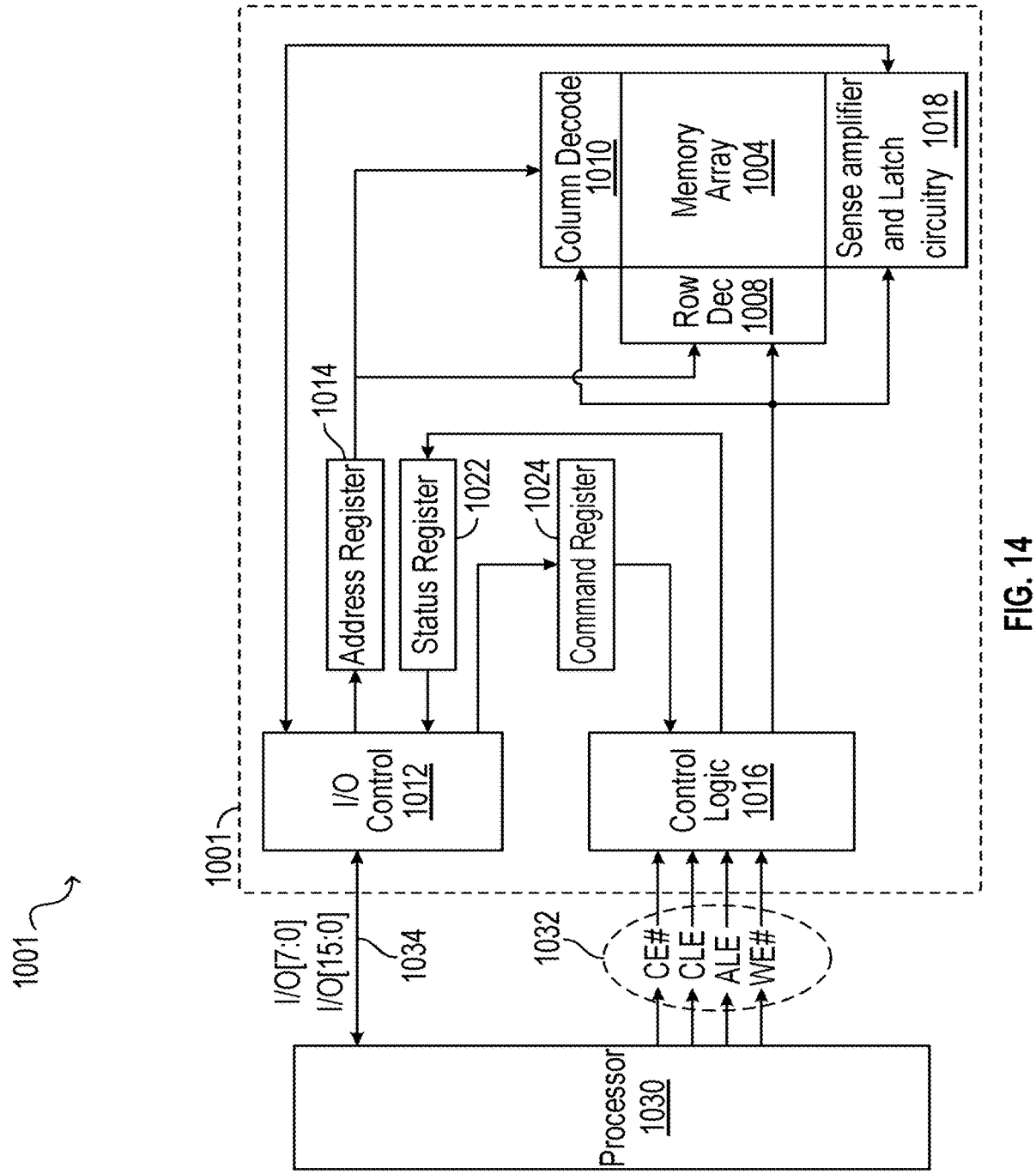
FIG. 14 is a block schematic of an electronic system, in accordance with exemplary embodiments of the disclosure.

FIG. 14 is a simplified block diagram of a memory device 1001 according to an embodiment of the disclosure, and on which various embodiments of the disclosure can be implemented. The memory device 1001 can include a memory array 1004 arranged in rows and columns. The memory array 1004 can include a plurality of channel structures that are formed in a stack of alternating word line layers and insulating layers. A row decode circuit 1008 and a column decode circuit 1010 are provided to decode address signals provided to the memory device 1001. Address signals are received and decoded to access the memory array 1004. Memory device 1001 can also include an input/output (I/O) control circuit 1012 to manage input of commands, addresses and data to the memory device 1001 as well as output of data and status information from the memory device 1001. An address register 1014 is coupled between the I/O control circuit 1012 and the row decode circuit 1008 and column decode circuit 1010 to latch the address signals prior to decoding. A command register 1024 is coupled between the I/O control circuit 1012 and a control logic (or control circuitry) 1016 to latch incoming commands.

The control logic 1016 can control access to the memory array 1004 in response to the commands and generate status information for the external processor 1030. The control logic 1016 is coupled to the row decode circuit 1008 and the column decode circuit 1010 to control the row decode circuit 1008 and column decode circuit 1010 in response to the addresses. The control logic 1016 can be also coupled to sense amplifier and latch circuitry (also referred to cache structure) 1018 to control the sense amplifier and latch circuitry 1018 in response to the commands and generate status information for the external processor 1030. In some embodiments, the control logic 1016 can include a verification level counter that is mentioned above. The sense amplifier and latch circuitry 1018 can be coupled to the memory array 1004 and can latch data, either incoming or outgoing, in the form of analog voltage levels. The sense amplifier and latch circuitry 1018 can include page buffers (e.g., the page buffer 500A), verification circuits (e.g., verification circuit 514), and BL bias circuits (e.g., the BL bias circuit 512) described above with respect to FIG. 5.

Still referring to FIG. 14, a status register 1022 can be coupled between the I/O control circuit 1012 and the control logic 1016 to latch the status information for output to the external processor 1030. The memory device 1001 receives control signals at control logic 1016 over a control link 1032. The control signals may include a chip enable CE #, a command latch enable CLE, an address latch enable ALE, and a write enable WE #. The memory device 1001 may receive commands in the form of command signals, addresses in the form of address signals, and data in the form of data signals from an external processor over a multiplexed input/output (I/O) bus 1034 and output data to the external processor over the I/O bus 1034.

The various embodiments described herein offer several advantages over related 3D-NAND devices. For example, in the related 3D-NAND devices, page buffers that include six latches are required for programming triple level cells of the related 3D-NAND devices. In the disclosure, a sensing scheme, which can be referred to as a non-inhibit verification, is provided for programming triple level cells of a 3D-NAND device. In the non-inhibit verification, a page buffer that includes five latches can be applied during the programming operation. Accordingly, a latch can be saved in the 3D-NAND as compared to the related 3D-NAND devices. In addition, in the non-inhibit verification, less page buffer operations can be applied when verification levels are switched.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of programming a memory device that includes a cache structure and memory cells, comprising:
   storing, by processing circuitry, inhibit information to first latch structures and second latch structures of the cache structure;
   applying, by the processing circuitry, a first state programming voltage to data lines of the memory cells to program the memory cells to a first state;
   applying, by the processing circuitry, a first state verification voltage to the data lines of the memory cells to perform a first state verification operation on the memory cells, the first state verification operation verifying first state threshold voltages of the memory cells based on a first target value and generating failure pattern data of the first state verification operation, the failure pattern data being stored to the second latch structures and indicating a first portion of the memory cells that passes the first state verification operation and a second portion of the memory cells that fails the first state verification operation; and
   applying, by the processing circuitry, a first state adjusted verification voltage to the data lines of the second portion of the memory cells that fails the first state verification operation to perform a first state adjusted verification operation on the second portion of the memory cells, the first state adjusted verification operation verifying the first state threshold voltages of the second portion of the memory cells to which the first state adjusted verification voltage is applied.

2. The method of claim 1, wherein the applying the first state programming voltage further comprises:
   applying the first state programming voltage to the data lines of the memory cells to program the memory cells to the first state based on a counter value of a verification state counter being less than a first value, wherein:
      the first value for the counter value of the verification state counter is eight, and
      the counter value of the verification state counter indicates which state of the memory cells is programmed.

3. The method of claim 2, wherein the applying the first state programming voltage further comprises:
   determining an initial first state programming voltage according to the inhibit information stored in the first latch structures and the counter value; and
   replacing the inhibit information with initial adjusted verification information in the first latch structures; and
   determining the first state programming voltage based on the initial first state programming voltage and the initial adjusted verification information, the initial adjusted verification information indicating which of the memory cells receive a previous adjusted verification voltage in a previous adjusted verification operation prior to the first state adjusted verification operation.

4. The method of claim 3, before the applying the first state verification voltage, the method further comprising:
   inverting the inhibit information in the first latch structures, wherein the inverted inhibit information indicates unverified states of the memory cells that include the first state and remaining states subsequent to the first state.

5. The method of claim 1, wherein the storing further comprises:
   storing lower page information of the memory cells to third latch structures of the cache structure;
   storing middle page information of the memory cells to fourth latch structures of the cache structure; and
   storing upper page information of the memory cells to fifth latch structures of the cache structure.

6. The method of claim 4, after the first state verification operation is performed, the method further comprising:
   adding first state failure verification information to the first latch structures, wherein the first state failure verification information indicates the second portion of the memory cells that fails the first state verification operation.

7. The method of claim 6, after the first state adjusted verification operation is performed, the method further comprising:
   storing the inhibit information and first state adjusted verification information to the second latch structures, the first state adjusted verification information indicating which of the memory cells receives the first state adjusted verification voltage.

8. The method of claim 7, after the first state verification operation is performed, the method further comprising:
   incrementing the counter value of the verification state counter in response to a failure rate of the failure pattern data being equal to or less than a second value.

9. The method of claim 8, after the first state adjusted verification operation is performed, the method further comprising:
   applying a second state verification voltage to the data lines of the memory cells and performing a second state verification operation on the memory cells to verify a second state threshold voltage of the memory cells based on a second target value; and
   applying a second state adjusted verification voltage to the data lines of a portion of the memory cells that fails the second state verification operation and performing a second state adjusted verification operation on a portion of the memory cells that fails the second state verification operation.

10. The method of claim 9, further comprising:
    adding second state failure verification information to the first latch structures, wherein the second state failure verification information is obtained from the second state verification operation and indicates the portion of the memory cells that fails the second state verification operation; and
    adding second state adjusted verification information to the second latch structures, wherein the second state adjusted verification information indicates which of the memory cells receives the second state adjusted verification voltage.

11. The method of claim 10, further comprising:
    storing the inhibit information, first state pass verification information, and second state pass verification information to the first latch structures, wherein the first state pass verification information is obtained from the first state verification operation and indicates the first portion of the memory cells that passes the first state verification operation, and the second state pass verification information indicates a portion of the memory cells that passes the second state verification operation; and determining whether the counter value of the verification state counter is greater than or equal to the first value; and in response to the determination that the counter value of the verification state counter is less than the first value, performing one of:
(i) programming and verifying the memory cells for the first state when the counter value of the verification state counter is unchanged; and
(ii) programming and verifying the memory cells for a subsequent state to the first state when the counter value of the verification state counter is increased by one.

12. The method of claim 11, wherein the programming the memory cells for the subsequent state to the first state comprises:
determining an initial subsequent state programming voltage according to the inhibit information stored in the first latch structures; and
replacing the inhibit information with adjusted verification information that includes the first state adjusted verification information and the second state adjusted verification information in the first latch structures;
determining a subsequent state programming voltage based on the initial subsequent state programming voltage and the adjusted verification information; and
applying the subsequent state programming voltage on the data lines of the memory cells to program the memory cells to the subsequent state.

13. The method of claim 12, wherein the verifying the memory cells for the subsequent state to the first state further comprises:
applying a subsequent state verification voltage to the data lines of the memory cells to perform a subsequent state verification operation on the memory cells, the subsequent state verification operation verifying a subsequent state threshold voltage of the memory cells based on a subsequent target value and generating failure pattern data of the subsequent state verification operation, the failure pattern data being stored to the second latch structures and indicating a first portion of the memory cells that passes the subsequent state verification operation and a second portion of the memory cells that fails the subsequent state verification operation; and
applying a subsequent state adjusted verification voltage to the data lines of the second portion of the memory cells that fails the subsequent state verification operation to perform a subsequent state adjusted verification operation on the second portion of the memory cells, the subsequent state adjusted verification operation verifying the subsequent state threshold voltage of the second portion of the memory cells to which the subsequent state adjusted verification voltage is applied.

14. A memory device, comprising:
a plurality of memory cells;
a cache structure that includes data line bias circuits coupled to data lines of the memory cells and configured to apply bias voltages to the data lines, and page buffers that include first latch structures and second latch structures, each of the data line bias circuits being coupled to a respective data line, and each of the page buffers including a respective first latch structure and a respective second latch structure; and
control circuitry coupled to the data lines of the memory cells, the first latch structures, and the second latch structures, and configured to:
store inhibit information to the first latch structures and the second latch structures;
apply a first state programming voltage through the data line bias circuits to the data lines of the memory cells to program the memory cells to a first state;
apply a first state verification voltage through the data line bias circuits to the data lines of the memory cells to perform a first state verification operation on the memory cells, the first state verification operation verifying first state threshold voltages of the memory cells based on a first target value and generating failure pattern data of the first state verification operation, the failure pattern data being stored to the second latch structures and indicating a first portion of the memory cells that passes the first state verification operation and a second portion of the memory cells that fails the first state verification operation; and
apply a first state adjusted verification voltage through the data line bias circuits to the data lines of the second portion of the memory cells that fails the first state verification to perform a first state adjusted verification operation on the second portion of the memory cells, the first state adjusted verification operation verifying the first state threshold voltages of the second portion of the memory cells to which the first state adjusted verification voltage is applied.

15. The memory device of claim 14, wherein the page buffers further comprise:
third latch structures that are configured to store lower page information of the memory cells;
fourth latch structures that are configured to store middle page information of the memory cells; and
fifth latch structures that are configured to store upper page information of the memory cells, wherein each of the page buffers includes a respective third latch structure, a respective fourth latch structure, and a respective fifth latch structure.

16. The memory device of claim 15, the control circuitry includes a verification state counter that is configured to:
increment a counter value of the verification state counter in response to a failure rate of the failure pattern data being equal to or less than a second value, the counter value of the verification state counter indicating in which state the memory cells is being programmed.

17. The memory device of claim 16, wherein the control circuitry is further configured to:
apply a first state programming voltage through the data line bias circuits to the data lines of the memory cells to program the memory cells to the first state based on the counter value of the verification state counter being less than a first value.

18. The memory device of claim 17, wherein the control circuitry is configured to:
determine an initial first state programming voltage according to the inhibit information stored in the first latch structures and the counter value; and
replace the inhibit information with initial adjusted verification information in the first latch structures, the initial adjusted verification information indicating which of the memory cells receive a previous adjusted verification voltage in a previous adjusted verification operation prior to the first state adjusted verification operation;

determine the first state programming voltage based on the first state initial programming voltage and the initial adjusted verification information; and apply the first state programming voltage through the data line bias circuits to the data lines of the memory cells for programing the memory cells to the first state.

19. The memory device of claim 18, wherein the control circuitry is further configured to:

invert the inhibit information in the first latch structures, wherein the inverted inhibit information indicates unverified states of the memory cells that include the first state and remaining states subsequent to the first state; and apply the first state verification voltage through the data line bias circuits to the data lines of the memory cells to perform the first state verification operation, the first state verification voltage being determined according to the inverted inhibit information stored in the first latch structures.

20. The memory device of claim 19, wherein the cache structure further comprises verification circuits, wherein:

each of the verification circuits is coupled to a respective data line, a respective first latch structure, and a respective second latch structure, the verification circuits are configured to read the memory cells to which the first state verification voltage is applied to verify whether the first state threshold voltages of the memory cells meet a first target value, and the failure pattern data of the first state verification operation is stored to the second latch structures through the verification circuits.

* * * * *